(12) United States Patent
Sheffield

(10) Patent No.: US 9,609,779 B1
(45) Date of Patent: Mar. 28, 2017

(54) APPARATUS FOR SECURING PRINTED CIRCUIT BOARDS

(71) Applicant: Rick Sheffield, Santa Clara, CA (US)

(72) Inventor: Rick Sheffield, Santa Clara, CA (US)

( * ) Notice: Subject to any disclaimer, the term of this patent is extended or adjusted under 35 U.S.C. 154(b) by 0 days.

(21) Appl. No.: 15/013,984

(22) Filed: Feb. 2, 2016

Related U.S. Application Data

(60) Provisional application No. 62/111,459, filed on Feb. 3, 2015.

(51) Int. Cl.
*H05K 7/14* (2006.01)
*H05K 13/00* (2006.01)

(52) U.S. Cl.
CPC ....... *H05K 7/1417* (2013.01); *H05K 13/0023* (2013.01)

(58) Field of Classification Search
None
See application file for complete search history.

(56) References Cited

U.S. PATENT DOCUMENTS

| | | | | |
|---|---|---|---|---|
| 3,596,139 A | * | 7/1971 | Walsh | H05K 7/1417 174/562 |
| 4,400,858 A | * | 8/1983 | Goiffon | E21B 47/011 138/108 |
| 4,444,318 A | * | 4/1984 | Alexander | H05K 7/142 211/41.17 |
| 5,014,163 A | * | 5/1991 | Lin | H05K 7/1444 361/791 |
| 5,227,958 A | * | 7/1993 | Glomski | H05K 7/1402 174/50 |
| 5,414,593 A | * | 5/1995 | Furlan | H05K 7/1461 174/268 |
| 6,757,177 B2 | * | 6/2004 | Harris | G02B 6/43 361/788 |
| 7,215,557 B2 | * | 5/2007 | Glovatsky | H05K 1/144 361/748 |
| 7,503,766 B2 | * | 3/2009 | Havermann | H01R 13/6456 439/594 |
| 7,907,419 B2 | * | 3/2011 | Costello | H05K 7/142 174/138 E |
| 8,018,727 B2 | * | 9/2011 | Westberg | G01D 11/24 174/138 E |
| 8,040,679 B2 | * | 10/2011 | Yeo | H01J 11/34 313/586 |
| 9,179,564 B2 | * | 11/2015 | Sechrist | H05K 7/1491 |
| 2004/0266249 A1 | * | 12/2004 | Dobbs | H05K 1/144 439/376 |
| 2008/0102655 A1 | * | 5/2008 | Lin | H05K 7/1417 439/76.1 |
| 2009/0000169 A1 | * | 1/2009 | Houssain | G09F 15/0068 40/605 |
| 2013/0148318 A1 | * | 6/2013 | Kim | H05K 9/0035 361/759 |
| 2013/0329387 A1 | * | 12/2013 | Huang | H05K 3/301 361/767 |

(Continued)

*Primary Examiner* — Xanthia C Cunningham
(74) *Attorney, Agent, or Firm* — Jill A. Jacobson

(57) ABSTRACT

Apparatus and methods are provided for securing a component such as a printed circuit board in a device at a single edge of the component, thereby facilitating removal and replacement, increasing unobstructed access for attachments and cabling, and improving potential density capacity of the components within a device.

15 Claims, 3 Drawing Sheets

(56) References Cited

U.S. PATENT DOCUMENTS

2014/0157589 A1* 6/2014 Huang ................. H05K 7/1417
 29/729
2014/0168918 A1* 6/2014 Sun ..................... H05K 7/1417
 361/759

* cited by examiner

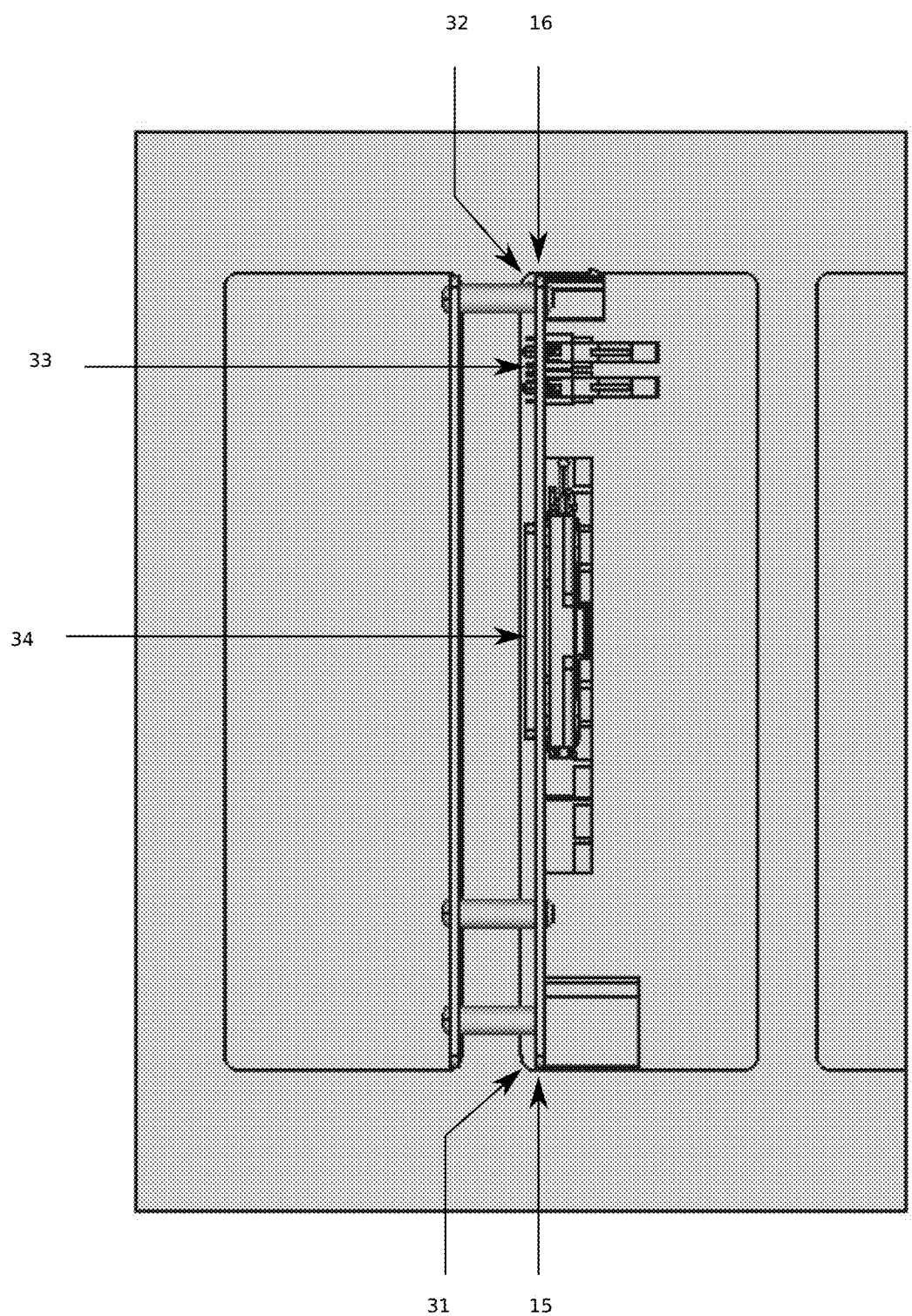
Fig. 3 Top View

APPARATUS FOR SECURING PRINTED CIRCUIT BOARDS

CROSS-REFERENCE TO RELATED APPLICATIONS

This application claims the benefit of U.S. Provisional Application No. 62/111,459, filed Feb. 3, 2015, which is incorporated by reference herein in its entirety.

FIELD OF THE INVENTION

The invention relates to an apparatus for holding and securing a printed circuit board (PCB) or other electronic component at a single edge, such that the remaining edges of the PCB are accessible for attachment to cabling or other devices and permitting dense packing of PCB's.

BACKGROUND

A printed circuit board ("PCB") contains embedded components for electrical circuits, connected by conductive tracks and other features that are etched from a conductive material, such as a copper sheet, that is laminated onto a non-conductive substrate. PCB's are incorporated in virtually all electronic products, computers, servers, etc.

A PCB must be secured to an enclosure in a device into which it is incorporated. Standoffs are often used to secure a PCB to an enclosure if it is not necessary to remove the PCB often and changeable components are easily accessible. However, this method makes it difficult to provide unobstructed access to the PCB to facilitate installation or assembly or for later removal, particularly after additional components are installed near the PCB.

Another standard way to secure a PCB is to use slots, which provide a channel on two ends for the PCB to slide into the enclosure such that it can easily be removed and replaced for repairs and upgrades. However, such an arrangement leaves only one edge of the PCB available for attachment of additional components such as cabling.

There is a need for an improved mounting mechanism for PCB's that facilitates installation and removal and which provides unobstructed access for attachments and cables.

BRIEF SUMMARY OF THE INVENTION

Apparatus and methods are provided for securing components, such as PCBs, in electronic devices.

In one aspect, an apparatus is provided, comprising: (a) a field replaceable unit (FRU), comprising: (i) a component that comprises a front face and a backing face that is opposed to the front face, and a bottom edge; (ii) a backer plate that comprises a first face, a second face opposed to the first face, and a bottom edge, and (ii) at least two bottom spacers attached in proximity to the bottom edges of the component and the backer plate, and configured to hold the bottom edges in a substantially parallel configuration relative to one another with space therebetween such that the backing face of the component faces the first face of the backer plate; and (b) a base plate, wherein the base plate comprises recessed pockets each with a recessed upper surface and a saddle between the pockets with a raised upper surface and parallel walls, wherein the saddle comprises a width and a height relative to the recessed upper surfaces of the pockets such that bottom edges of the component and the backer plate straddle the saddle and are secured in the apparatus.

In another aspect, a method is provided, comprising: securing a FRU in a base plate, wherein the FRU comprises (i) a component that comprises a front face and a backing face that is opposed to the front face, and a bottom edge; (ii) a backer plate that comprises a first face, a second face opposed to the first face, and a bottom edge, and (ii) at least two bottom spacers attached in proximity to the bottom edges of the component and the backer plate, and configured to hold the bottom edges in a substantially parallel configuration relative to one another with space therebetween such that the backing face of the component faces the first face of the backer plate, wherein the base plate comprises recessed pockets each with a recessed upper surface and a saddle between the pockets with a raised upper surface and parallel walls, wherein the saddle comprises a width and a height relative to the recessed upper surfaces of the pockets such that bottom edges of the component and the backer plate straddle the saddle and are secured in the apparatus, and wherein the method comprises inserting the FRU such that the backing face of the component and the first face of the backer plate straddle the saddle at their bottom edges, thereby securing the component.

BRIEF DESCRIPTION OF THE DRAWINGS

FIG. 3 is a plan view from directly above all components.

DETAILED DESCRIPTION

The invention provides an apparatus for securing a component such as a PCB. This invention provides a way to secure a PCB or other component such that it can easily be removed and replaced but holds the component from one edge only, which may give the following advantages, including, but not limited to:

Maximizes options and space for cabling to the PCB as all edges are accessible except one.

Minimizes area needed as a plurality of PCBs can be more densely packed.

Simple to create with minimal components.

Provides clearance by design for solder joints and other protrusions which may be on the rear of the PCB.

Figure 1:
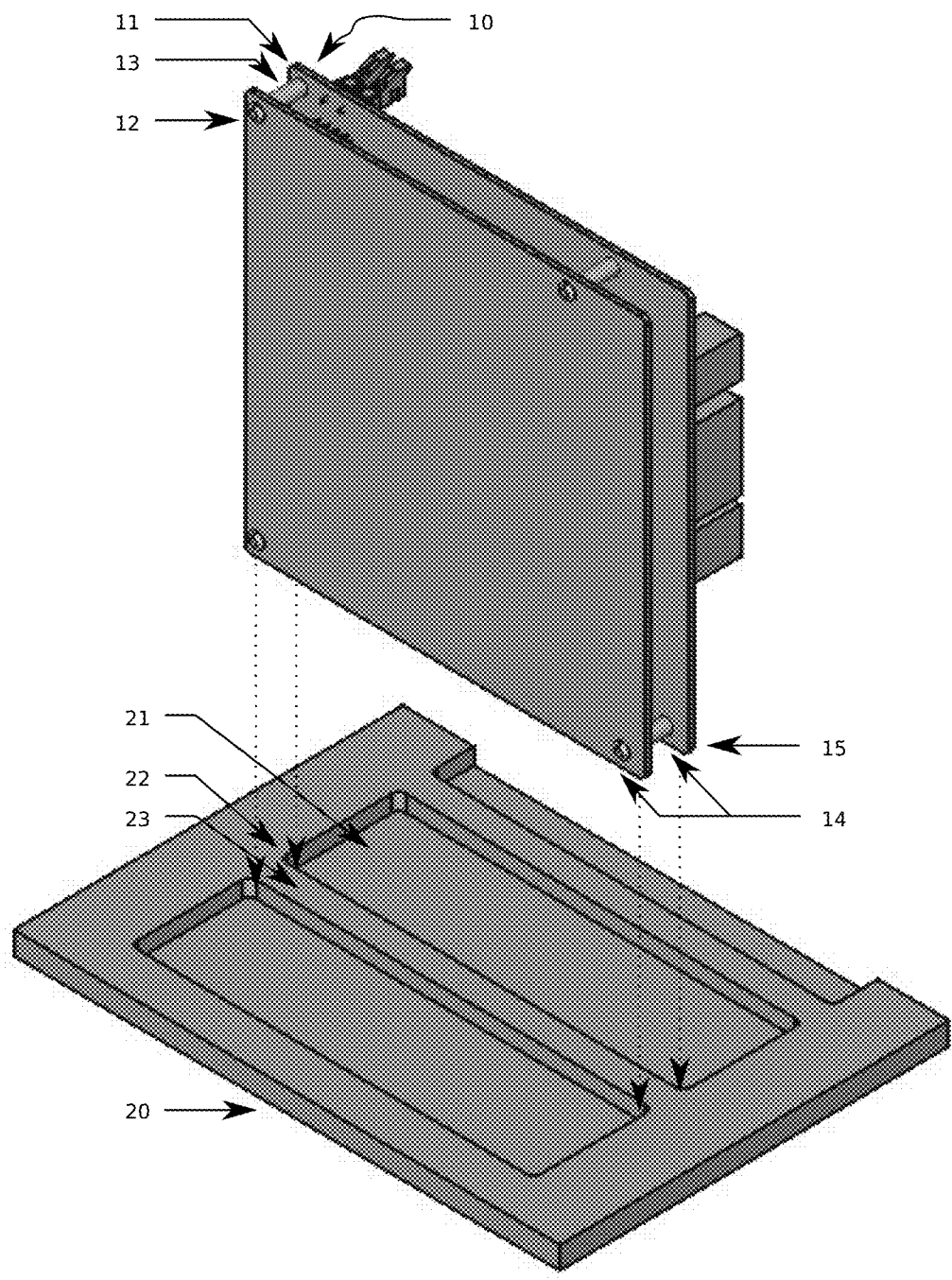
FIG. 1 is a perspective view from above of all components embodying the invention before the PCB is secured.

The components of an embodiment of the apparatus are shown in FIG. 1:

A Field Replaceable Unit (termed "FRU" herein) 10 is created by attaching a PCB 11 to a Backer Plate 12. The PCB may be connected to the Backer Plate, for example, using common Standoffs 13.

A Base Plate 20 is created by cutting an array of "pockets" 21 with a given Pocket Corner Radius 22 into plate material. The coincidence of these pockets defines a raised area 23 therebetween, relative to the top surface of the adjacent pockets (termed "Saddle" herein).

The FRU 10 components may be of any dimensions that are suitable for the device into which the FRU will be incorporated, e.g., hand-held electronic device, computer, server, etc. In one embodiment, the FRU is sized to accommodate a mini-ITX format mother board, e.g., with PCB and backer plate faces 7 inch×7 inch.

In the assembled FRU, at least one edge of the PCB is parallel or substantially parallel to at least one edge of the backer plate when connected with standoffs or separator hardware, and configured such that the parallel or substantially parallel edges will fit snugly around a saddle in the base plate when the apparatus is assembled, as described herein. The distance between the parallel edges may be any suitable distance. In one embodiment, the PCB and the backer plate are connected with ½ inch standoffs.

PCB 11 as depicted in FIG. 1 is not limited to a PCB. The PCB 11 may include a PCB and/or may include other component(s) in addition to or in place of a PCB, in the apparatus described herein. "PCB" herein may refer to a PCB or another component, as described herein. For example, any planar or substantially planar component or a component on a planar or substantially planar backer plate may be secured, for example, in an electronic device, computer, server, etc., as described herein. Non-limiting examples of such components include one or more hard drives and/or one or more PCB's secured to a backer plate, or a display. Generally, the apparatus is designed and dimensioned to meet the requirements of the PCB or other component to be secured.

The backer plate 12 may be constructed of any material that will maintain structural integrity when assembling the FRU and when held in place in the assembled apparatus, e.g., when fitted around and held in place around a saddle, as described herein. Suitable materials include, but are not limited to, aluminum, steel, plastic, metal, wood, composite, etc. The backer plate may be constructed in any way that will produce a material that will maintain structural integrity, for example, but not limited to, pressed, cut, layered, etc. The backer plate could also be another PCB. In one embodiment, the backer plate comprises aluminum.

A "standoff" 13 herein refers to a spacer that separates two parts from one another, e.g., a separator between the PCB and the backer plate. Any "separator" hardware may be used in place of or in addition to Standoffs 13 that separates the two plates and maintains the integrity of the separation such that the plate faces remain in a parallel configuration in the apparatus.

The base plate 20 may be constructed of any material that will maintain structural integrity in the assembled apparatus, e.g., when the FRU is fitted into and maintained in place around the saddle, as described herein. Suitable materials include, but are not limited to, aluminum, steel, plastic, metal, wood, composite, etc. The base plate may be constructed in any way that will produce a material that will maintain structural integrity, for example, but not limited to, pressed, cut, layered, etc. In one embodiment, the base plate comprises aluminum plate.

A pocket 21 may comprise any dimensions of length, width, corner radius, and depth that are suitable to receive and retain an edge of the FRU as described herein. Generally, the corner radii are used to adjust the distance between the saddle edge and the PCB.

An apparatus as disclosed herein includes a PCB and a backer plate with faces that are parallel or substantially parallel and held apart by separators (a "FRU"), secured by fitting the parallel faces of the FRU around a saddle that is a raised area between two pockets in a base plate, such that when the FRU is fitted around the saddle, movement of the PCB and backer plate is substantially reduced or eliminated.

In one embodiment, the base plate does not include pockets, and the saddle is a raised area relative to a planar base plate, with parallel edges around which the PCB and backer plate are secured by tightly fitting around and in contact with the edges of the saddle.

Figure 2:
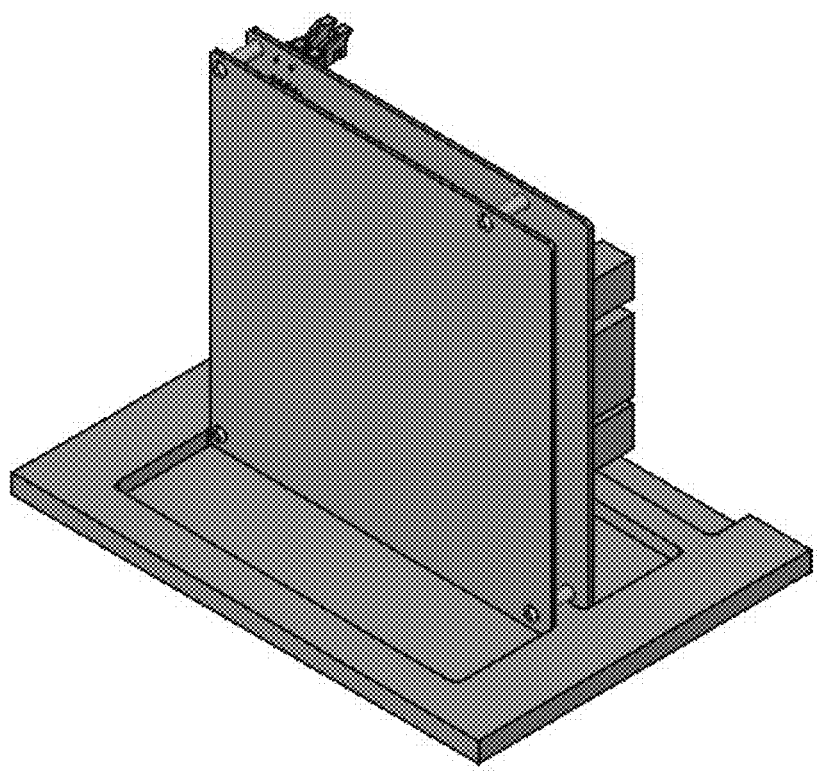
FIG. 2 is the same components shown in FIG. 1 after the PCB has been secured.

To achieve the intended results of this invention, FRU 10 and a Base Plate 20 are produced as described above. The FRU 10 is then lowered toward the Base Plate such that the PCB 11 and the Backer Plate 12 straddle a saddle 23. An embodiment of an assembled apparatus is shown in FIG. 2. The bottom edges 14 of the PCB and Backer Plate should squarely contact the bottom of the Pockets 21.

There are many alternative ways this invention can be implemented, including but not limited to embodiments as described below.

In some embodiments, the rear face of the PCB 11 does not contact the side edge of the saddle 23. Rather, PCB lower corners 15 and 16 contact the Pocket Corner Radii 31 and 32 at their furthest point from the saddle 23 as shown in FIG. 3, to provide clearance for solder joints and/or protrusions 33, 34 on the rear of the PCB 11 if necessary. In one embodiment, the distance between the back face of the PCB and the edge of the saddle is about ⅛ inch. In some embodiments, the PCB or backer plate face contacts the edge of the saddle, as shown in FIG. 2.

In some embodiments, bottom edges of the PCB and backer plate contact the recessed surface of the pocket. In other embodiments, bottom edges of the PCB and backer plate do not contact the recessed surface of the pocket.

In some embodiments, separators contact the surface of the saddle. In other embodiments, the separators do not contact the surface of the saddle. In some embodiments, the saddle comprises grooves into which the separators fit when the apparatus is assembled.

In some embodiments, in the assembled apparatus, the faces of the PCB and backer plate are at a 90 degree angle or substantially at a 90 degree angle relative to the base plate. In some embodiments of the assembled apparatus, at least a portion of the face of the PCB and at least a portion of the face of the backer plate, each of which portions are contiguous with the edges that are fitted around the saddle, are at a 90 degree angle or substantially at a 90 degree angle relative to the base plate.

In some embodiments, instead of a PCB and an inert backer plate, the FRU may comprise two PCBs, with edges that are parallel or substantially parallel to each other configured to fit around a saddle, as described herein, i.e., the backer plate is a PCB. In some embodiments, other components are mounted to the backer plate for example, a hard drive, display, etc.

In some embodiments, all components (e.g., backer plate, base plate) may be made of the same or different materials as needed.

In some embodiments, all components (e.g., backer plate, base plate) may be sized and depths and radii adjusted as needed.

In various embodiments, the manufacturing of the Base Plate 20, e.g., production of pockets 21 in plate material, can be accomplished in a number of ways, including but not limited to, computer numerical control (CNC) milling/routing, layered sheeting, molding, etc.

In some embodiments, another plate may be substituted for PCB 11. For example, a second backer plate may be substituted, and other devices or smaller PCB's may be mounted onto the second backer plate.

In various embodiments, the Base Plate 20 may be mounted in an enclosure, may be part of an enclosure, or may be standalone as needed.

In some embodiments, a secured cover could be used to capture the FRU 10 such that it cannot escape the saddle 23. For example, a cover may be secured, e.g., screwed or otherwise held or clipped down so that it can't move. For example, a chassis cover may include a bolted or secured lid.

In some embodiments, backplanes, connections, adapters etc. could be used in conjunction with the FRU 10 and Base Plate 20.

In some embodiments, other devices can be mounted to the PCB Backer Plate 12 for example, hard drives.

In some embodiments, latching mechanisms could be used such that the FRU 10 could not escape the saddle 23 allowing vertical placement of the Base Plate 20.

In some embodiments, any number of Saddles 23 can be created in the Base Plate 20 in any configuration including both faces as needed. In various embodiments, multiple saddles may be configured parallel to each other or at any angle relative to one another, depending on the requirements or configuration of the device into which the FRU's will be incorporated.

In some embodiments, additional pockets can be cut in the Base Plate 20, or additional cutouts of greater depth within the pockets that surround a saddle, to allow clearance for protrusions from the FRU 10.

Although the foregoing invention has been described in some detail by way of illustration and examples for purposes of clarity of understanding, it will be apparent to those skilled in the art that certain changes and modifications may be practiced without departing from the spirit and scope of the invention, which is delineated in the appended claims. Therefore, the description should not be construed as limiting the scope of the invention.

I claim:

1. An apparatus for securing a component of an electronic device, comprising:
    (a) a field replaceable unit (FRU), comprising: (i) a component that comprises a front face and a backing face that is opposed to the front face, and a bottom edge; (ii) a backer plate that comprises a first face, a second face opposed to the first face, and a bottom edge, and (ii) at least two bottom spacers attached in proximity to the bottom edges of the component and the backer plate, and configured to hold the bottom edges in a substantially parallel configuration relative to one another with space therebetween such that the backing face of the component faces the first face of the backer plate; and
    (b) a base plate, wherein the base plate comprises recessed pockets each with a recessed upper surface and a saddle between the pockets with a raised upper surface and parallel walls, wherein the saddle comprises a width and a height relative to the recessed upper surfaces of the pockets such that bottom edges of the component and the backer plate straddle the saddle and are secured in the apparatus;
    wherein the pockets comprise corners between the edge that forms the saddle and an outer edge of the pocket, wherein each of said corners comprises a curved radius, wherein the FRU is retained by contact between corners of the bottom edges of the component and the backer plate and the curved radii of the pockets.

2. An apparatus according to claim 1, wherein the pockets comprise outer edges that are substantially orthogonal relative to the saddle walls, and wherein and the FRU is retained in the apparatus with the corners of the bottom edges of the component and the backer plate contacting the outer edges of the pocket and maintaining a tight fit within the apparatus.

3. An apparatus according to claim 1, wherein the component is a printed circuit board (PCB), hard drive, display, or another backer plate with mounted components.

4. An apparatus according to claim 1, wherein the FRU is retained with space between the backing face of the component and the saddle wall that it faces.

5. An apparatus according to claim 1, wherein the component is retained by contact with the saddle wall.

6. An apparatus according to claim 1, wherein the backer plate is a plate, hard drive, display, or another PCB.

7. An apparatus according to claim 1, wherein the spacers are standoffs.

8. An apparatus according to claim 1, further comprising at least two top spacers attached in proximity of the top edges of the component and the backer plate, and configured to hold the top edges in a substantially parallel configuration relative to one another with space therebetween, wherein the parallel distance between the top edges and the bottom edges of the component and the backer plate is the same.

9. An apparatus according to claim 1, wherein the backer plate comprises aluminum.

10. An apparatus according to claim 1, wherein the base plate comprises aluminum.

11. An apparatus according to claim 1, wherein the bottom spacers contact the raised upper surface of the saddle.

12. An apparatus according to claim 11, wherein the bottom spacers are retained in grooves in the raised upper surface.

13. An apparatus according to claim 1, wherein the bottom spacers do not contact the raised upper surface of the saddle.

14. A method for securing a component of an electronic device, comprising:
    securing a FRU in a base plate,
    wherein the FRU comprises (i) a component that comprises a front face and a backing face that is opposed to the front face, and a bottom edge; (ii) a backer plate that comprises a first face, a second face opposed to the first face, and a bottom edge, and (ii) at least two bottom spacers attached in proximity to the bottom edges of the component and the backer plate, and configured to hold the bottom edges in a substantially parallel configuration relative to one another with space therebetween such that the backing face of the component faces the first face of the backer plate,
    wherein the base plate comprises recessed pockets each with a recessed upper surface and a saddle between the pockets with a raised upper surface and parallel walls, wherein the saddle comprises a width and a height relative to the recessed upper surfaces of the pockets such that bottom edges of the component and the backer plate straddle the saddle and are secured in the apparatus, and
    wherein the method comprises inserting the FRU such that the backing face of the component and the first face of the backer plate straddle the saddle at their bottom edges, thereby securing the component;
    wherein the pockets comprise corners between the edge that forms the saddle and an outer edge of the pocket, wherein each of said corners comprises a curved radius, wherein the FRU is retained by contact between corners of the bottom edges of the component and the backer plate and the curved radii of the pockets.

15. A method according to claim 14, wherein the component is a PCB, hard drive, display, or another backer plate with mounted components.

* * * * *